US008547189B2

(12) United States Patent
Sasaki et al.

(10) Patent No.: US 8,547,189 B2
(45) Date of Patent: Oct. 1, 2013

(54) ELECTRONIC COMPONENT

(75) Inventors: Hiroyuki Sasaki, Nagaokakyo (JP);
Ikuo Tamaru, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/592,387

(22) Filed: Aug. 23, 2012

(65) Prior Publication Data
US 2012/0319800 A1 Dec. 20, 2012

Related U.S. Application Data

(63) Continuation of application No. PCT/JP2012/050721, filed on Jan. 16, 2012.

(30) Foreign Application Priority Data

Feb. 16, 2011 (JP) .................................. 2011-030574

(51) Int. Cl.
*H01P 1/20* (2006.01)
*H03H 7/01* (2006.01)
(52) U.S. Cl.
USPC .......................................... 333/185; 333/202
(58) Field of Classification Search
USPC ........................... 333/185, 175, 202, 236, 172
See application file for complete search history.

(56) References Cited

U.S. PATENT DOCUMENTS

| | | | |
|---|---|---|---|
| 6,177,850 B1 * | 1/2001 | Furutani et al. ................ | 333/185 |
| 6,970,057 B2 * | 11/2005 | Lin et al. ........................ | 333/177 |
| 7,423,500 B2 * | 9/2008 | Ishiwata ........................ | 333/172 |
| 7,542,264 B2 * | 6/2009 | Oshima ........................ | 361/306.3 |
| 7,711,389 B2 * | 5/2010 | Furutani et al. ............. | 455/552.1 |
| 8,018,299 B2 * | 9/2011 | Chin et al. ..................... | 333/175 |

FOREIGN PATENT DOCUMENTS

| | | |
|---|---|---|
| CN | 2882068 Y | 3/2007 |
| CN | 201294372 Y | 8/2009 |
| GB | 2 402 005 A | 11/2004 |
| JP | 05-199006 A | 8/1993 |
| JP | 2003-068569 A | 3/2003 |
| JP | 2004-172602 A | 6/2004 |
| TW | 200710891 A | 3/2007 |

OTHER PUBLICATIONS

Official Communication issued in International Patent Application No. PCT/JP2012/050721, mailed on Apr. 17, 2012.

\* cited by examiner

*Primary Examiner* — Dean O Takaoka
*Assistant Examiner* — Alan Wong
(74) *Attorney, Agent, or Firm* — Keating & Bennett, LLP

(57) ABSTRACT

An electronic component includes a capacitor having a desired capacitance value and a laminate including a plurality of laminated insulating material layers. Land electrodes are provided on a bottom surface of the laminate. Internal conductors face the land electrodes, respectively, across the insulating material layer within the laminate, have areas larger than those of the land electrodes, respectively, and contain the land electrodes, respectively, when seen in a planar view from a z-axis direction. A capacitor conductor is provided on the positive direction side of the capacitor conductors in the z-axis direction and faces the capacitor conductors.

4 Claims, 10 Drawing Sheets

ELECTRONIC COMPONENT

BACKGROUND OF THE INVENTION

1. Field of the Invention

The present invention relates to an electronic component, and more specifically, relates to an electronic component that includes a laminate including a plurality of laminated insulating material layers.

2. Description of the Related Art

As an existing electronic component, for example, a surface-mounted component described in Japanese Unexamined Patent Application Publication No. 2003-68569 is known. FIG. 11 is a cross-sectional structure diagram of an electronic device 500 that includes a surface-mounted component 510 described in Japanese Unexamined Patent Application Publication No. 2003-68569.

The electronic device 500 in FIG. 11 includes the surface-mounted component 510 and a mother substrate 523. The surface-mounted component 510 includes a module substrate 521, a land conductor 522, and an internal electrode 526. The module substrate 521 has a lamination structure including a conductor and a non-conductor. The land conductor 522 is provided on a bottom surface of the module substrate 521. The internal electrode 526 is provided within the module substrate 521 and faces the land conductor 522 across the non-conductor. The mother substrate 523 includes a corresponding electrode 524 and is a substrate on which the surface-mounted component 510 is mounted. The corresponding electrode 524 is provided on a top surface of the mother substrate 523. In the electronic device 500, the land conductor 522 and the corresponding electrode 524 are connected to each other by solder or the like, whereby the surface-mounted component 510 is mounted on the mother substrate 523.

In the surface-mounted component 510 as described above, the land conductor 522 and the internal electrode 526 face each other, thereby constituting a capacitor. Thus, a circuit within the module substrate 521 and the mother substrate 523 are electrically connected to each other via the capacitor.

However, the surface-mounted component 510 has a problem that it is difficult to have a desired capacitance value at the capacitor including the land conductor 522 and the internal electrode 526 as described below. More specifically, the land conductor 522 and the internal electrode 526 face each other so as to coincide with each other when seen in a planar view from the upper side. Thus, if the position where the land conductor 522 or the internal electrode 526 is printed shifts even slightly, the area of the portion where the land conductor 522 and the internal electrode 526 face each other is changed. As a result, the capacitance value of the capacitor including the land conductor 522 and the internal electrode 526 is changed.

SUMMARY OF THE INVENTION

Therefore, preferred embodiments of the present invention provide an electronic component that includes a capacitor having a desired capacitance value.

An electronic component according to an aspect of a preferred embodiment of the present invention includes a laminate including a plurality of laminated insulating material layers; a land electrode provided on a bottom surface of the laminate; a first capacitor conductor facing the land electrode across the insulating material layer within the laminate, having an area larger than that of the land electrode, and containing the land electrode when seen in a planar view from a lamination direction; and a second capacitor conductor provided on an upper side of the first capacitor conductor in the lamination direction and facing the first capacitor conductor.

According to a preferred embodiment of the present invention, even when a lamination shift occurs during a laminating process, an electronic component that includes a capacitor having a desired capacitance value can be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, an electronic component according to preferred embodiments of the present invention will be described with reference to the drawings.

First Preferred Embodiment

Figure 1:
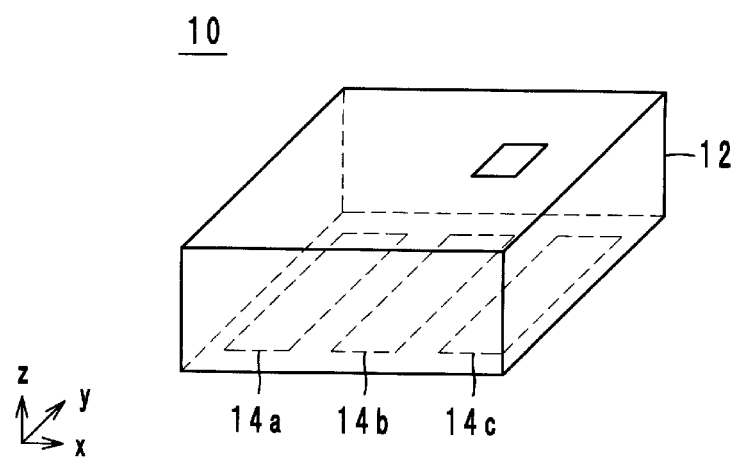
FIG. 1 is an external perspective view of an electronic component according to a first preferred embodiment of the present invention.
Figure 2:
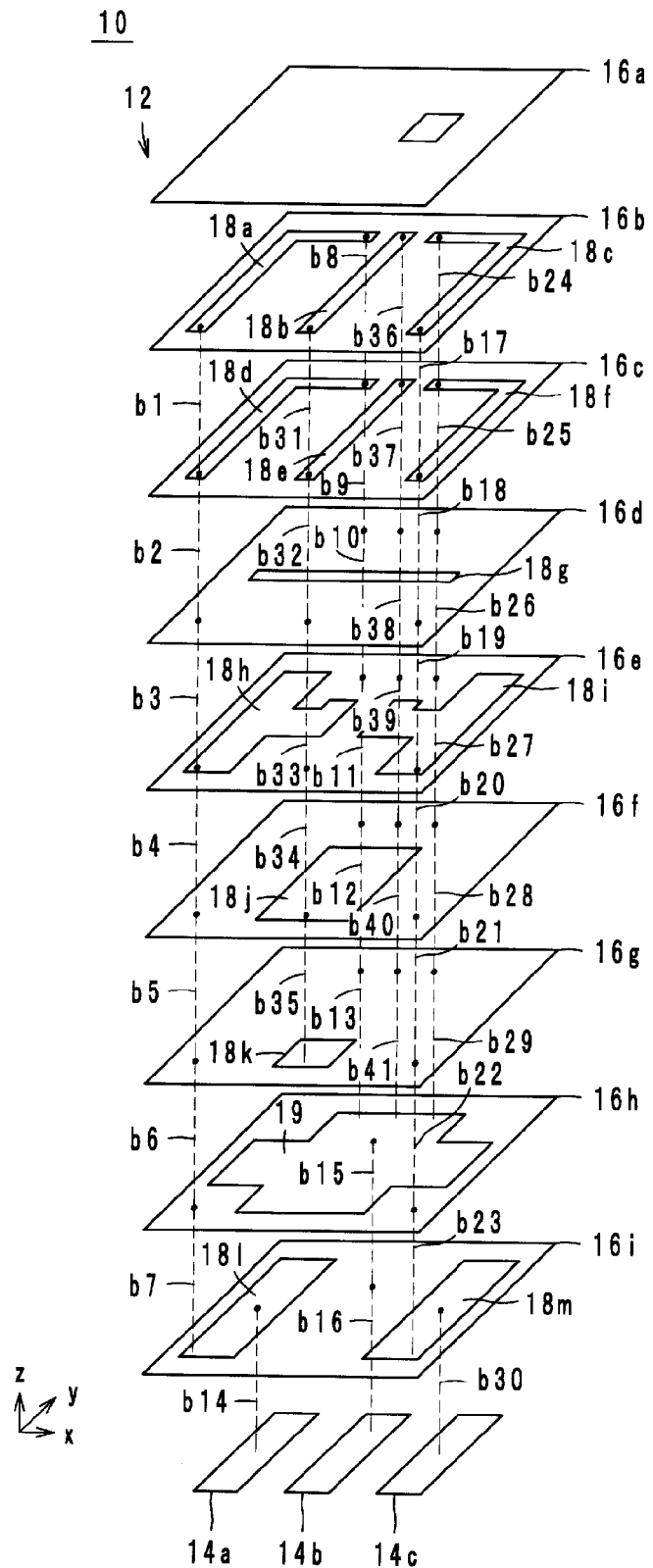
FIG. 2 is an exploded perspective view of the electronic component according to the first preferred embodiment of the present invention.
Figure 3:
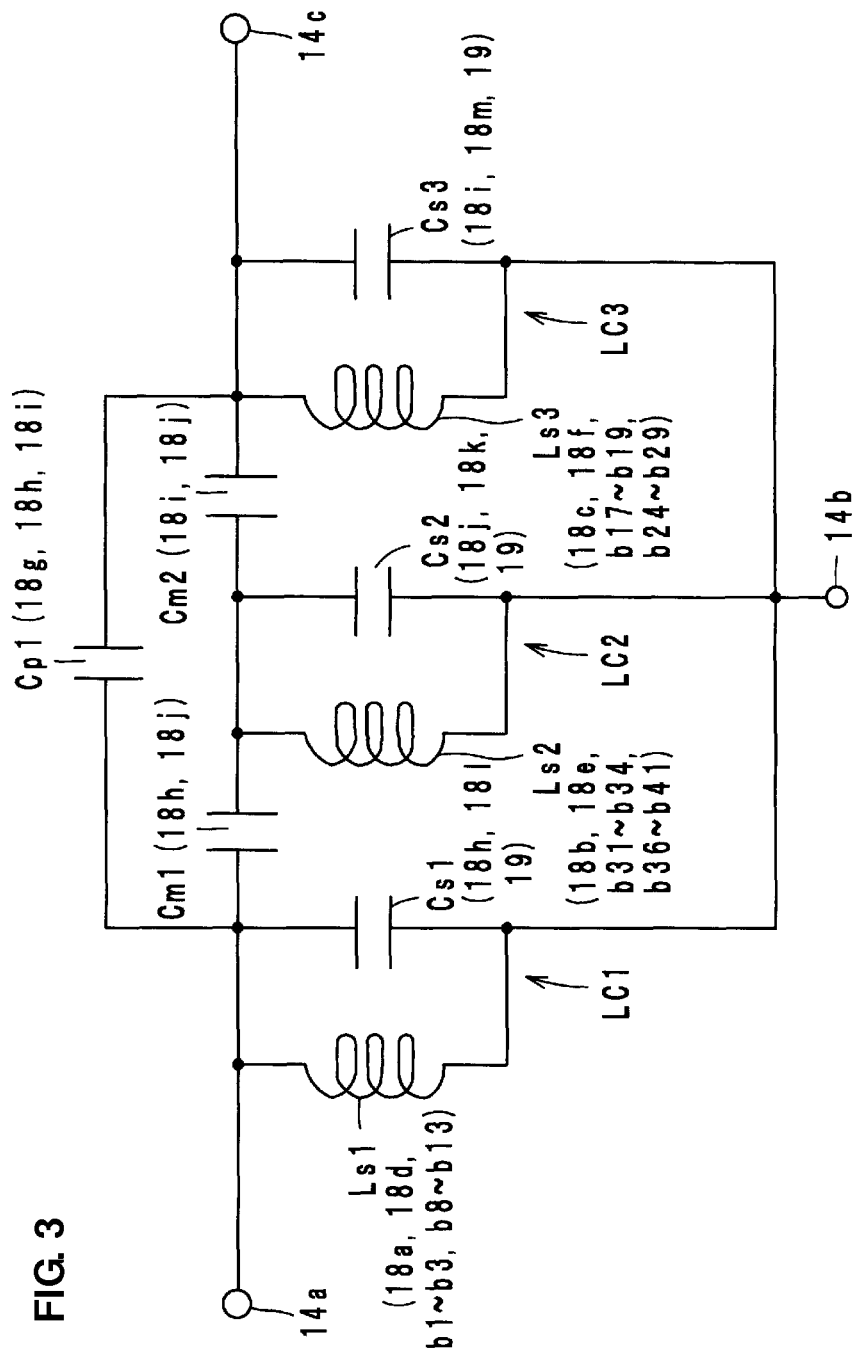
FIG. 3 is an equivalent circuit diagram of the electronic component according to the first preferred embodiment of the present invention.

Hereinafter, the configuration of an electronic component according to a first preferred embodiment of the present invention will be described with reference to the drawings. FIG. 1 is an external perspective view of the electronic component 10 according to the first preferred embodiment of the present invention. FIG. 2 is an exploded perspective view of the electronic component 10 according to the first preferred embodiment of the present invention. FIG. 3 is an equivalent circuit diagram of the electronic component 10 according to the first preferred embodiment of the present invention. Hereinafter, a lamination direction of the electronic component 10 is defined as a z-axis direction. In addition, when the electronic component 10 is seen in a planar view from the z-axis direction, a direction along the long sides of the electronic component 10 is defined as an x-axis direction, and a direction along the short sides of the electronic component 10 is defined as a y-axis direction.

As shown in FIGS. 1 and 2, the electronic component 10 includes a laminate 12, land electrodes 14 (14a to 14c), internal conductors 18 (18a to 18m), a ground conductor 19, and via-hole conductors b (b1 to b41).

As shown in FIG. 2, the laminate 12 includes a plurality of laminated rectangular insulating material layers 16 (16a to 16i) and has a rectangular parallelepiped shape. Each insulating material layer 16 has a rectangular or substantially rectangular shape and is preferably formed from, for example, a Ba—Al—Si ceramic dielectric material. The insulating material layers 16a to 16i are laminated in order from the positive direction side to the negative direction side in the z-axis direction. Hereinafter, the principal surface of each insulating material layer 16 on the positive direction side in the z-axis direction is referred to as a front surface, and the principal surface of each insulating material layer 16 on the negative direction side in the z-axis direction is referred to as a back surface.

The land electrodes 14a to 14c are provided on the back surface of the insulating material layer 16i (the bottom surface of the laminate 12) and each have a rectangular or substantially rectangular shape extending in the y-axis direction. In other words, the electronic component 10 has a so-called LGA (Land Grid Array) structure. It should be noted that for easy understanding, in FIG. 2, the land electrodes 14a to 14c are shown in a state where the land electrodes 14a to 14c are separated from the back surface of the insulating material layer 16i. The land electrodes 14a to 14c are aligned in order from the negative direction side to the positive direction side in the x-axis direction. The land electrode 14a is used as an input terminal. The land electrode 14b is used as a ground terminal. The land electrode 14c is used as an output terminal.

The internal conductors 18 and the ground conductor 19 are preferably formed from a conductive material containing Cu as a principal component and are provided on the front surfaces of the insulating material layers 16. The via-hole conductors b are formed preferably by filling via holes extending through the insulating material layers 16 in the z-axis direction with a conductive material containing Cu as a principal component. The land electrodes 14, the internal conductors 18, the ground conductor 19, and the via-hole conductors b constitute coils Ls1 to Ls3 and capacitors Cs1 to Cs3, Cm1, Cm2, and Cp1 (see FIG. 3) included in the laminate 12 as described below.

As shown in FIGS. 2 and 3, the coil Ls1 includes the internal conductors 18a and 18d and the via-hole conductors b1 to b3 and b8 to b13. More specifically, the internal conductors 18a and 18d are provided on the front surfaces of the insulating material layers 16b and 16c, respectively, and each have an L shape extending in the y-axis direction and bending at an end on the positive direction side in the y-axis direction to the positive direction side in the x-axis direction. The internal conductor 18a and the internal conductor 18d preferably have the same shape and overlap each other so as to coincide with each other when seen in a planar view from the z-axis direction. In addition, the via-hole conductor b1 extends through the insulating material layer 16b in the z-axis direction and connects an end of the internal conductor 18a to an end of the internal conductor 18d. The via-hole conductor b8 extends through the insulating material layer 16b in the z-axis direction and connects another end of the internal conductor 18a to another end of the internal conductor 18d. Thus, the internal conductors 18a and 18d are connected to each other.

The via-hole conductors b2 and b3 extend through the insulating material layers 16c and 16d, respectively, in the z-axis direction. The via-hole conductors b2 and b3 are connected in series, thereby constituting a single via-hole conductor. The end of the via-hole conductor b2 on the positive direction side in the z-axis direction is connected to the end of the internal conductor 18d. The end of the via-hole conductor b3 on the negative direction side in the z-axis direction is connected to an end of the internal conductor 18h.

The via-hole conductors b9 to b13 extend through the insulating material layers 16c to 16g in the z-axis direction. The via-hole conductors b9 to b13 are connected in series, thereby constituting a single via-hole conductor. The end of the via-hole conductor b9 on the positive direction side in the z-axis direction is connected to the other end of the internal conductor 18d.

As described above, the coil Ls1 preferably is a loop coil having a substantially U shape when seen in a planar view from the positive direction side in the x-axis direction.

The internal conductor 18l is provided on the front surface of the insulating material layer 16i and has a rectangular or substantially rectangular shape extending in the y-axis direction. The internal conductor 18l faces the land electrode 14a across the insulating material layer 16i within the laminate 12, has an area larger than that of the land electrode 14a, and contains the land electrode 14a when seen from the positive direction side in the z-axis direction (the lamination direction).

The capacitor Cs1 preferably includes the internal conductors 18h and 18l and the ground conductor 19. The internal conductor 18h is provided on the front surface of the insulating material layer 16e and has a T shape including a portion extending in the y-axis direction and a portion projecting from the center of the portion in the y-axis direction toward the positive direction side in the x-axis direction. The ground conductor 19 is provided on the insulating material layer 16h and has a cross shape. The ground conductor 19 is provided on the negative direction side of the internal conductor 18h in the z-axis direction (on the lower side thereof in the lamination direction) and on the positive direction side of the internal conductor 18l in the z-axis direction (on the upper side thereof in the lamination direction). The internal conductor 18h and the ground conductor 19 face each other across the insulating material layers 16e, 16f, and 16g, and the internal conductor 18l and the ground conductor 19 face each other across the insulating material layer 16h. Thus, the capacitor Cs1 is provided between the internal conductors 18h and 18l and the ground conductor 19.

The via-hole conductors b4 to b7 extend through the insulating material layers 16e to 16h in the z-axis direction. The via-hole conductors b4 to b7 are connected in series, thereby constituting a single via-hole conductor. The end of the via-hole conductor b4 on the positive direction side in the z-axis direction is connected to the end of the via-hole conductor b3 on the negative direction side in the z-axis direction. The end of the via-hole conductor b7 on the negative direction side in the z-axis direction is connected to the internal conductor 18l. In addition, the end of the via-hole conductor b13 on the negative direction side in the z-axis direction is connected to the ground conductor 19. Thus, the coil Ls1 and the capacitor Cs1 are connected in parallel, thereby constituting an LC parallel resonator LC1.

In addition, the via-hole conductor b14 extends through the insulating material layer 16i in the z-axis direction. The end of the via-hole conductor b14 on the positive direction side in the z-axis direction is connected to the internal conductor 18*l*. The end of the via-hole conductor b14 on the negative direction side in the z-axis direction is connected to the land electrode 14*a*. Thus, the LC parallel resonator LC1 including the coil Ls1 and the capacitor Cs1 is connected to the land electrode 14*a* via the via-hole conductor b14.

In addition, the via-hole conductors b15 and b16 extend through the insulating material layers 16*h* and 16*i* in the z-axis direction. The via-hole conductors b15 and b16 are connected in series, thereby constituting a single via-hole conductor. The end of the via-hole conductor b15 on the positive direction side in the z-axis direction is connected to the ground conductor 19. The end of the via-hole conductor b16 on the negative direction side is connected to the land electrode 14*b*. Thus, the LC parallel resonator LC1 including the coil Ls1 and the capacitor Cs1 is connected to the land electrode 14*b* via the via-hole conductors b15 and b16.

As shown in FIGS. 2 and 3, the coil Ls2 including the internal conductors 18*b* and 18*e* and the via-hole conductors b31 to b34 and b36 to b41. More specifically, the internal conductors 18*b* and 18*e* are provided on the front surfaces of the insulating material layers 16*b* and 16*c* and on the positive direction sides of the internal conductors 18*a* and 18*d* in the x-axis direction, respectively and each have a rectangular or substantially rectangular shape extending in the y-axis direction. The internal conductor 18*b* and the internal conductor 18*e* preferably have the same shape and overlap each other so as to coincide with each other when seen in a planar view from the z-axis direction. In addition, the via-hole conductor b31 extends through the insulating material layer 16*b* in the z-axis direction and connects an end of the internal conductor 18*b* to an end of the internal conductor 18*e*. The via-hole conductor b36 extends through the insulating material layer 16*b* in the z-axis direction and connects another end of the internal conductor 18*b* to another end of the internal conductor 18*e*. Thus, the internal conductors 18*b* and 18*e* are connected to each other.

The via-hole conductors b32 to b34 extend through the insulating material layers 16*c* to 16*e*, respectively, in the z-axis direction. The via-hole conductors b32 to b34 are connected in series, thereby constituting a single via-hole conductor. The end of the via-hole conductor b32 on the positive direction side in the z-axis direction is connected to the end of the internal conductor 18*e*.

The via-hole conductors b37 to b41 extend through the insulating material layers 16*c* to 16*g* in the z-axis direction. The via-hole conductors b37 to b41 are connected in series, thereby constituting a single via-hole conductor. The end of the via-hole conductor b37 on the positive direction side in the z-axis direction is connected to the other end of the internal conductor 18*e*.

As described above, the coil Ls2 preferably is a loop coil having a substantially U shape when seen in a planar view from the positive direction side in the x-axis direction.

The capacitor Cs2 preferably includes the internal conductors 18*j* and 18*k* and the ground conductor 19. The internal conductors 18*j* and 18*k* are provided on the front surfaces of the insulating material layers 16*f* and 16*g*, respectively and each have a rectangular or substantially rectangular shape. The via-hole conductor b35 extends through the insulating material layer 16*f* in the z-axis direction. The end of the via-hole conductor b35 on the positive direction side in the z-axis direction is connected to the internal conductor 18*j*. The end of the via-hole conductor b35 on the negative direction side in the z-axis direction is connected to the internal conductor 18*k*. The internal conductor 18*j* and the ground conductor 19 face each other across the insulating material layers 16*f* and 16*g*. The internal conductor 18*k* and the ground conductor 19 face each other across the insulating material layer 16*g*. Thus, the capacitor Cs2 is provided between the internal conductors 18*j* and 18*k* and the ground conductor 19.

The end of the via-hole conductor b34 on the negative direction side in the z-axis direction is connected to the internal conductor 18*j*. In addition, the end of the via-hole conductor b41 on the negative direction side in the z-axis direction is connected to the ground conductor 19. Thus, the coil Ls2 and the capacitor Cs2 are connected in parallel, thereby constituting an LC parallel resonator LC2. In addition, the LC parallel resonator LC2 including the coil Ls2 and the capacitor Cs2 is connected to the land electrode 14*b* via the via-hole conductors b15 and b16.

As shown in FIGS. 2 and 3, the coil Ls3 preferably includes the internal conductors 18*c* and 18*f* and the via-hole conductors b17 to b19 and b24 to b29. More specifically, the internal conductors 18*c* and 18*f* are provided on the front surfaces of the insulating material layers 16*b* and 16*c*, respectively, and each have an L shape extending in the y-axis direction and bending at an end on the positive direction side in the y-axis direction to the negative direction side in the x-axis direction. The internal conductor 18*c* and the internal conductor 18*f* have the same shape and overlap each other so as to coincide with each other when seen in a planar view from the z-axis direction. In addition, the via-hole conductor b17 extends through the insulating material layer 16*b* in the z-axis direction and connects an end of the internal conductor 18*c* to an end of the internal conductor 18*f*. The via-hole conductor b24 extends through the insulating material layer 16*b* in the z-axis direction and connects another end of the internal conductor 18*c* to another end of the internal conductor 18*f*. Thus, the internal conductors 18*c* and 18*f* are connected to each other.

The via-hole conductors b18 and b19 extend through the insulating material layers 16*c* and 16*d*, respectively, in the z-axis direction. The via-hole conductors b18 and b19 are connected in series, thereby constituting a single via-hole conductor. The end of the via-hole conductor b18 on the positive direction side in the z-axis direction is connected to the end of the internal conductor 18*f*. The end of the via-hole conductor b19 on the negative direction side in the z-axis direction is connected to the end of the internal conductor 18*i*.

The via-hole conductors b25 to b29 extend through the insulating material layers 16*c* to 16*g* in the z-axis direction. The via-hole conductors b25 to b29 are connected in series, thereby constituting a single via-hole conductor. The end of the via-hole conductor b25 on the positive direction side in the z-axis direction is connected to the other end of the internal conductor 18*f*.

As described above, the coil Ls3 preferably is a loop coil having a substantially U shape when seen in a planar view from the positive direction side in the x-axis direction.

The internal conductor 18*m* is provided on the front surface of the insulating material layer 16*i* and has a rectangular or substantially rectangular shape extending in the y-axis direction. The internal conductor 18*m* faces the land electrode 14*c* across the insulating material layer 16*i* within the laminate 12, has an area larger than that of the land electrode 14*c*, and contains the land electrode 14*c* when seen from the positive direction side in the z-axis direction (the lamination direction).

The capacitor Cs3 preferably includes the internal conductors 18*i* and 18*m* and the ground conductor 19. The internal conductor 18*i* is provided on the front surface of the insulating material layer 16*e* and has a T shape including a portion extending in the y-axis direction and a portion projecting from the center of the portion in the y-axis direction toward the negative direction side in the x-axis direction. The ground conductor 19 is provided on the negative direction side of the internal conductor 18i in the z-axis direction (on the lower side thereof in the lamination direction) and on the positive direction side of the internal conductor 18m in the z-axis direction (on the upper side thereof in the lamination direction). The internal conductor 18i and the ground conductor face each other across the insulating material layers 16e, 16f, and 16g, and the internal conductor 18m and the ground conductor 19 face each other across the insulating material layer 16h. Thus, the capacitor Cs3 is provided between the internal conductors 18i and 18m and the ground conductor 19.

The via-hole conductors b20 to b23 extend through the insulating material layers 16e to 16h in the z-axis direction. The via-hole conductors b20 to b23 are connected in series, thereby constituting a single via-hole conductor. The end of the via-hole conductor b20 on the positive direction side in the z-axis direction is connected to the end of the via-hole conductor b19 on the negative direction side in the z-axis direction. The end of the via-hole conductor b23 on the negative direction side in the z-axis direction is connected to the internal conductor 18m. In addition, the end of the via-hole conductor b29 on the negative direction side in the z-axis direction is connected to the ground conductor 19. Thus, the coil Ls3 and the capacitor Cs3 are connected in parallel, thereby constituting an LC parallel resonator LC3.

In addition, the via-hole conductor b30 extends through the insulating material layer 16i in the z-axis direction. The end of the via-hole conductor b30 on the positive direction side in the z-axis direction is connected to the internal conductor 18m. The end of the via-hole conductor b30 on the negative direction side in the z-axis direction is connected to the land electrode 14c. Thus, the LC parallel resonator LC3 including the coil Ls3 and the capacitor Cs3 is connected to the land electrode 14c via the via-hole conductor b30. In addition, the LC parallel resonator LC3 including the coil Ls3 and the capacitor Cs3 is connected to the land electrode 14b via the via-hole conductors b15 and b16.

The capacitor Cm1 including the internal conductor 18h and the internal conductor 18j. The internal conductor 18h and the internal conductor 18j face each other across the insulating material layer 16e. Thus, the capacitor Cm1 is provided between the internal conductors 18h and 18j.

The capacitor Cm2 preferably includes the internal conductor 18i and the internal conductor 18j. The internal conductor 18i and the internal conductor 18j face each other across the insulating material layer 16e. Thus, the capacitor Cm2 is provided between the internal conductors 18i and 18j.

The capacitor Cp1 preferably includes the internal conductor 18g and the internal conductors 18h and 18i. The internal conductor 18g is provided on the front surface of the insulating material layer 16d and has a rectangular or substantially rectangular shape extending in the x-axis direction. The internal conductor 18g and the internal conductors 18h and 18i face each other across the insulating material layer 16d. Thus, two capacitors are provided between the internal conductors 18h and 18g and between the internal conductors 18g and 18i. These two capacitors are connected in series, thereby constituting the capacitor Cp1.

The electronic component 10 configured as described above is used as, for example, a band-pass filter. More specifically, the impedances of the LC parallel resonators LC1 to LC3 become maximum at their resonant frequencies. Thus, the LC parallel resonators LC1 to LC3 do not pass high-frequency signals having frequencies around their resonant frequencies. In other words, high-frequency signals having frequencies around the resonant frequencies of the LC parallel resonators LC1 to LC3 do not flow from the external electrode 14a to the external electrode 14b and flow from the external electrode 14a to the external electrode 14c. On the other hand, the impedances of the LC parallel resonators LC1 to LC3 are relatively low at frequencies other than the frequencies around the resonant frequencies of the LC parallel resonators LC1 to LC3. Thus, the frequencies other than the frequencies around the resonant frequencies of the LC parallel resonators LC1 to LC3 pass through the LC parallel resonators LC1 to LC3 and flow to the ground via the external electrode 14b. As described above, the electronic component 10 serves as a band-pass filter that passes only high-frequency signals having frequencies around the resonant frequencies of the LC parallel resonators LC1 to LC3.

In the electronic component 10, desired capacitance values can be obtained at the capacitors Cs1 and Cs3 having desired capacitance values. More specifically, the internal conductors 18l and 18m face the land electrodes 14a and 14c, respectively, across the insulating material layer 16i within the laminate 12, have areas larger than those of the land electrodes 14a and 14c, respectively, and contain the land electrodes 14a and 14c, respectively, when seen from the positive direction side in the z-axis direction (the lamination direction). Thus, even when the positions where the internal conductors 18l, 18m, 18h, and 18i constituting the capacitors Cs1 and Cs3 or the land electrodes 14a and 14c are printed shift slightly, a state is kept in which the land electrodes 14a and 14c are contained in the internal conductors 18l and 18m when seen in a planar view from the z-axis direction. Thus, in the electronic component 10, formation of capacitances due to the land electrodes 14a and 14c protruding from the internal conductors 18l and 18m to face the ground electrode 19 is significantly reduced and prevented. Therefore, deviation of the capacitors Cs1 and Cs3 from the desired capacitance values is significantly reduced and prevented.

In addition, in the electronic component 10, even when the capacitors Cs1 and Cs3 having desired capacitance values are obtained, insulation between the land electrodes 14a to 14c can be kept. More specifically, when the areas of the land electrodes 14a and 14c are increased in order to obtain desired capacitance values, the intervals between the land electrodes 14a to 14c decrease. Meanwhile, when the electronic component 10 is mounted on a substrate, the land electrodes 14a to 14c are connected to lands on the substrate by means of solder. Thus, when the intervals between the land electrodes 14a to 14c decrease, there is the possibility that the land electrodes 14a to 14c are connected to each other via solder when being mounted by means of solder. In other words, the insulation between the land electrodes 14a to 14c is not kept.

Thus, in the electronic component 10, the areas of the internal conductors 18l and 18m are larger than the areas of the land electrodes 14a and 14c. Since the internal conductors 18l and 18m are included in the electronic component 10, the internal conductors 18l and 18m are not mounted via solder like the land electrodes 14a to 14c. Thus, when the electronic component 10 is mounted onto a substrate, there is no possibility that a short circuit occurs between the internal conductors 18l and 18m. Thus, it is easy to make the internal conductors 18l and 18m close to each other as compared to the land electrodes 14a to 14c. In other words, it is easy to make the internal conductors 18l and 18m large in size as compared to the land electrodes 14a to 14c. Due to the above, in the electronic component 10, even when the capacitors Cs1 and Cs3 having desired capacitance values are obtained, the insulation between the land electrodes 14a to 14c can be kept.

Second Preferred Embodiment

Figure 4:
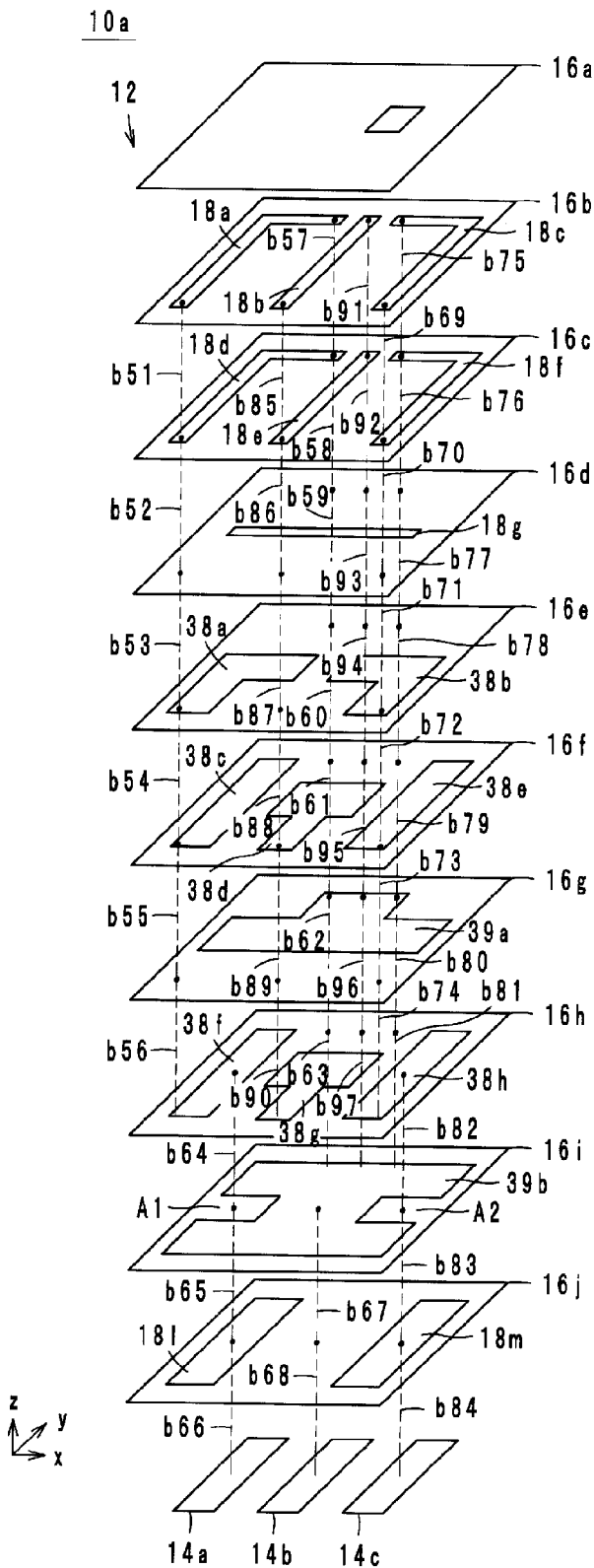
FIG. 4 is an exploded perspective view of an electronic component according to a second preferred embodiment of the present invention.
Figure 5:
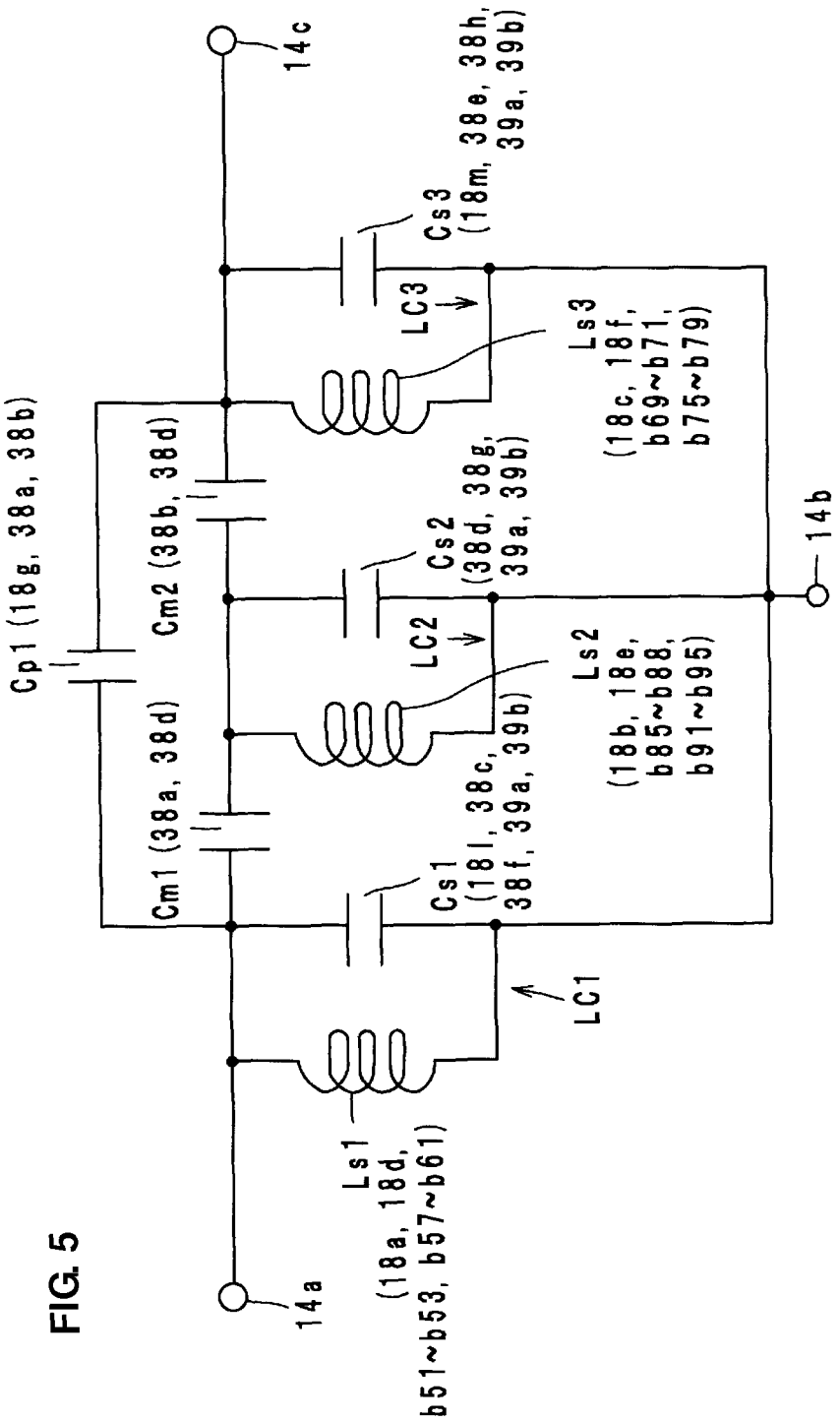
FIG. 5 is an equivalent circuit diagram of the electronic component according to the second preferred embodiment of the present invention.

Hereinafter, the configuration of an electronic component 10a according to a second preferred embodiment will be described with reference to the drawings. FIG. 4 is an exploded perspective view of the electronic component 10a according to the second preferred embodiment. FIG. 5 is an equivalent circuit diagram of the electronic component 10a according to the second preferred embodiment. It should be noted that for an external perspective view of the electronic component 10a, FIG. 1 is used. It should be noted that among the elements of the electronic component 10a, the same elements as those of the electronic component 10 are designated by the same reference signs.

As shown in FIG. 4, the electronic component 10a includes a laminate 12, land electrodes 14 (14a to 14c), internal conductors 18 (18a to 18g, 18l, and 18m) and 38 (38a to 38h), ground conductors 39 (39a and 39b), and via-hole conductors b (b51 to b97).

As shown in FIG. 4, the laminate 12 includes a plurality of laminated rectangular insulating material layers 16 (16a to 16j) and preferably has a rectangular or substantially rectangular parallelepiped shape. Each insulating material layer 16 has a rectangular or substantially rectangular shape and is formed from, for example, a Ba—Al—Si ceramic dielectric material. The insulating material layers 16a to 16j are laminated in order from the positive direction side to the negative direction side in the z-axis direction. Hereinafter, the principal surface of each insulating material layer 16 on the positive direction side in the z-axis direction is referred to as a front surface, and the principal surface of each insulating material layer 16 on the negative direction side in the z-axis direction is referred to as a back surface.

The land electrodes 14a to 14c are provided on the back surface of the insulating material layer 16j (the bottom surface of the laminate 12) and each have a rectangular or substantially rectangular shape extending in the y-axis direction. In other words, the electronic component 10a has a so-called LGA (Land Grid Array) structure. It should be noted that for easy understanding, in FIG. 4, the land electrodes 14a to 14c are shown in a state where the land electrodes 14a to 14c are separated from the back surface of the insulating material layer 16j. The land electrodes 14a to 14c are aligned in order from the negative direction side to the positive direction side in the x-axis direction. The land electrode 14a is used as an input terminal. The land electrode 14b is used as a ground terminal. The land electrode 14c is used as an output terminal.

The internal conductors 18 and 38 and the ground conductors 39 are preferably made of a conductive material containing Cu as a principal component and are provided on the front surfaces of the insulating material layers 16. The via-hole conductors b are formed preferably by filling via holes extending through the insulating material layers 16 in the z-axis direction with a conductive material containing Cu as a principal component. The land electrodes 14, the internal conductors 18 and 38, the ground conductors 39, and the via-hole conductors b constitute coils Ls1 to Ls3 and capacitors Cs1 to Cs3, Cm1, Cm2, and Cp1 (see FIG. 5) included in the laminate 12 as described below.

As shown in FIGS. 4 and 5, the coil Ls1 includes the internal conductors 18a and 18d and the via-hole conductors b51 to b53 and b57 to b61. More specifically, the internal conductors 18a and 18d are provided on the front surfaces of the insulating material layers 16b and 16c, respectively, and each have an L shape extending in the y-axis direction and bending at an end on the positive direction side in the y-axis direction to the positive direction side in the x-axis direction. The internal conductor 18a and the internal conductor 18d preferably have the same shape and overlap each other so as to coincide with each other when seen in a planar view from the z-axis direction. In addition, the via-hole conductor b51 extends through the insulating material layer 16b in the z-axis direction and connects an end of the internal conductor 18a to an end of the internal conductor 18d. The via-hole conductor b57 extends through the insulating material layer 16b in the z-axis direction and connects another end of the internal conductor 18a to another end of the internal conductor 18d. Thus, the internal conductors 18a and 18d are connected to each other.

The via-hole conductors b52 and b53 extend through the insulating material layers 16c and 16d, respectively, in the z-axis direction. The via-hole conductors b52 and b53 are connected in series, thereby constituting a single via-hole conductor. The end of the via-hole conductor b52 on the positive direction side in the z-axis direction is connected to the end of the internal conductor 18d.

The via-hole conductors b58 to b61 extend through the insulating material layers 16c to 16f in the z-axis direction. The via-hole conductors b58 to b61 are connected in series, thereby constituting a single via-hole conductor. The end of the via-hole conductor b58 on the positive direction side in the z-axis direction is connected to the other end of the internal conductor 18d.

As described above, the coil Ls1 preferably is a loop coil having a substantially U shape when seen in a planar view from the positive direction side in the x-axis direction.

The internal conductor 18l is provided on the front surface of the insulating material layer 16j and has a rectangular or substantially rectangular shape extending in the y-axis direction. The internal conductor 18l faces the land electrode 14a across the insulating material layer 16j within the laminate 12, has an area larger than that of the land electrode 14a, and contains the land electrode 14a when seen from the positive direction side in the z-axis direction (the lamination direction). No conductor layer is provided between the internal conductor 18l and the land electrode 14a.

The capacitor Cs1 preferably includes the internal conductors 18l, 38c, and 38f and the ground conductors 39a and 39b. The internal conductors 38c and 38f are provided on the front surfaces of the insulating material layers 16f and 16h, respectively, and each have a rectangular or substantially rectangular shape extending in the y-axis direction. The ground conductor 39a is provided on the front surface of the insulating material layer 16g and has a T shape including a portion extending in the x-axis direction and a portion projecting from the center of the portion in the x-axis direction toward the negative direction side in the y-axis direction. The ground conductor 39b is provided on the front surface of the insulating material layer 16i and has a rectangular or substantially rectangular or substantially rectangular shape. It should be noted that the ground conductor 39b is provided with a cut A1 recessed from the side (outer rim) on the negative direction side in the x-axis direction toward the positive direction side in the x-axis direction and a cut A2 recessed from the side (outer rim) on the positive direction side in the x-axis direction toward the negative direction side in the x-axis direction.

Figure 6:
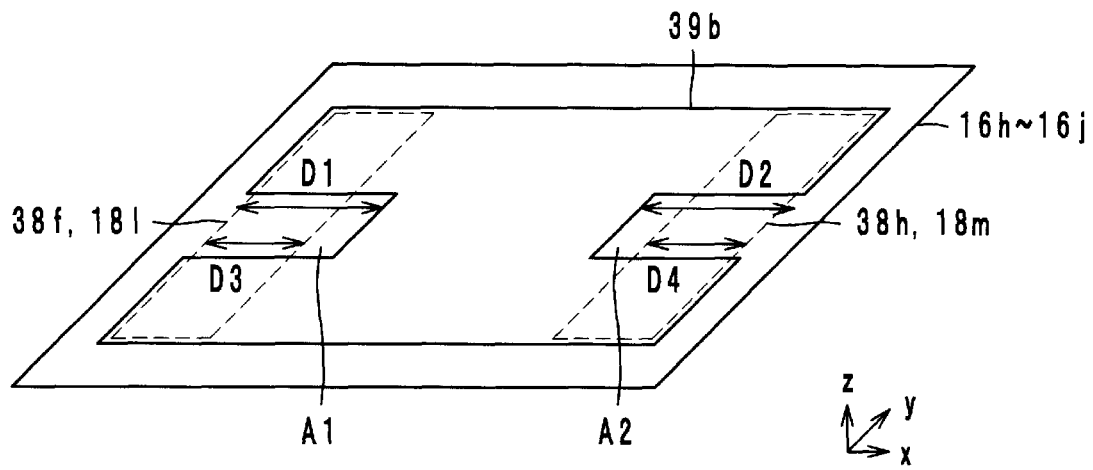
FIG. 6 is a diagram in which insulating material layers are laminated.

Here, the shapes of the cuts A1 and A2 in the electronic component 10a will be described with reference to the drawing. FIG. 6 is a diagram in which the insulating material layers 16h to 16j are laminated. It should be noted that for easy understanding, the internal conductor 38g is omitted.

The depths D1 and D2 of the cuts A1 and A2 in the x-axis direction are larger than the widths D3 and D4, respectively, in the x-axis direction, of the portions of the internal conductors 18*l*, 18*m*, 38*f*, and 38*h* that overlap the cuts A1 and A2.

Furthermore, the ground conductor 39*b* is provided on the positive direction side of the internal conductor 18*l* in the z-axis direction (on the upper side thereof in the lamination direction). In addition, the internal conductor 38*f* is provided on the positive direction side of the ground conductor 39*b* in the z-axis direction (on the upper side thereof in the lamination direction). Thus, the internal conductor 18*l* and the ground conductor 39*b* face each other across the insulating material layer 16*i*. Similarly, the internal conductor 38*f* and the ground conductor 39*b* face each other across the insulating material layer 16*h*. In other words, capacitances are provided between the internal conductors 18*l* and 38*f* and the ground conductor 39*b*, respectively.

Furthermore, the ground conductor 39*a* is provided on the positive direction side of the internal conductor 38*f* in the z-axis direction (on the upper side thereof in the lamination direction). In addition, the internal conductor 38*c* is provided on the positive direction side of the ground conductor 39*a* in the z-axis direction (on the upper side thereof in the lamination direction). Thus, the internal conductor 38*f* and the ground conductor 39*a* face each other across the insulating material layer 16*g*. Similarly, the internal conductor 38*c* and the ground conductor 39*a* face each other across the insulating material layer 16*f*. In other words, capacitances are provided between the internal conductors 38*c* and 38*f* and the ground conductor 39*a*, respectively.

In addition, the via-hole conductors b54 to b56 extend through the insulating material layers 16*e* to 16*g* in the z-axis direction. The via-hole conductors b54 to b56 are connected in series, thereby constituting a single via-hole conductor. The end of the via-hole conductor b54 on the positive direction side in the z-axis direction is connected to the end of the via-hole conductor b53 on the negative direction side in the z-axis direction. The end of the via-hole conductor b54 on the negative direction side in the z-axis direction is connected to the internal conductor 38*c*. The end of the via-hole conductor b56 on the negative direction side in the z-axis direction is connected to the internal conductor 38*f*.

In addition, the via-hole conductors b64 and b65 extend through the insulating material layers 16*h* and 16*i* in the z-axis direction. The via-hole conductors b64 and b65 are connected in series, thereby constituting a single via-hole conductor. The via-hole conductors b64 and b65 extend through the inside of the cut A1. The end of the via-hole conductor b64 on the positive direction side in the z-axis direction is connected to the internal conductor 38*f*. The end of the via-hole conductor b65 on the negative direction side in the z-axis direction is connected to the internal conductor 18*l*. In other words, the via-hole conductors b64 and b65 connect the internal conductor 18*l* to the internal conductor 38*f*.

Since the internal conductors 18*l*, 38*c*, and 38*f* are connected as described above, four capacitors including the internal conductors 18*l*, 38*c*, and 38*f* and the ground conductors 39*a* and 39*b* are connected. By the four capacitors, the capacitor Cs1 is provided.

In addition, as described above, the end of the via-hole conductor b65 on the negative direction side in the z-axis direction is connected to the internal conductor 18*l*. Furthermore, the via-hole conductors b62 and b63 extend through the insulating material layers 16*g* and 16*h* in the z-axis direction. The via-hole conductors b62 and b63 are connected in series, thereby constituting a single via-hole conductor. The end of the via-hole conductor b62 on the positive direction side in the z-axis direction is connected to the end of the via-hole conductor b61 on the negative direction side in the z-axis direction. The end of the via-hole conductor b63 on the negative direction side in the z-axis direction is connected to the ground conductor 39*b*. Thus, the coil Ls1 and the capacitor Cs1 are connected in parallel, thereby constituting an LC parallel resonator LC1.

In addition, the via-hole conductor b66 extends through the insulating material layer 16*j* in the z-axis direction. The end of the via-hole conductor b66 on the positive direction side in the z-axis direction is connected to the internal conductor 18*l*. The end of the via-hole conductor b66 on the negative direction side in the z-axis direction is connected to the land electrode 14*a*. Thus, the LC parallel resonator LC1 including the coil Ls1 and the capacitor Cs1 is connected to the land electrode 14*a* via the via-hole conductor b66.

In addition, the via-hole conductors b67 and b68 extend through the insulating material layers 16*i* and 16*j* in the z-axis direction. The via-hole conductors b67 and b68 are connected in series, thereby constituting a single via-hole conductor. The end of the via-hole conductor b67 on the positive direction side in the z-axis direction is connected to the ground conductor 39*b*. The end of the via-hole conductor b68 on the negative direction side in the z-axis direction is connected to the land electrode 14*b*. Thus, the LC parallel resonator LC1 including the coil Ls1 and the capacitor Cs1 is connected to the land electrode 14*b* via the via-hole conductors b67 and b68.

As shown in FIGS. 4 and 5, the coil Ls2 preferably includes the internal conductors 18*b* and 18*e* and the via-hole conductors b85 to b88 and b91 to b95. More specifically, the internal conductors 18*b* and 18*e* are provided on the front surfaces of the insulating material layers 16*b* and 16*c* and on the positive direction sides of the internal conductors 18*a* and 18*d* in the x-axis direction, respectively, and each have a rectangular or substantially rectangular or substantially rectangular shape extending in the y-axis direction. The internal conductor 18*b* and the internal conductor 18*e* have the same shape and overlap each other so as to coincide with each other when seen in a planar view from the z-axis direction. In addition, the via-hole conductor b85 extends through the insulating material layer 16*b* in the z-axis direction and connects an end of the internal conductor 18*b* to an end of the internal conductor 18*e*. The via-hole conductor b91 extends through the insulating material layer 16*b* in the z-axis direction and connects another end of the internal conductor 18*b* to another end of the internal conductor 18*e*. Thus, the internal conductors 18*b* and 18*e* are connected in parallel.

The via-hole conductors b86 to b88 extend through the insulating material layers 16*c* to 16*e*, respectively, in the z-axis direction. The via-hole conductors b86 to b88 are connected in series, thereby constituting a single via-hole conductor. The end of the via-hole conductor b86 on the positive direction side in the z-axis direction is connected to the end of the internal conductor 18*e*.

The via-hole conductors b92 to b95 extend through the insulating material layers 16*c* to 16*f* in the z-axis direction. The via-hole conductors b92 to b95 are connected in series, thereby constituting a single via-hole conductor. The end of the via-hole conductor b92 on the positive direction side in the z-axis direction is connected to the other end of the internal conductor 18*e*.

As described above, the coil Ls2 preferably is a loop coil having a substantially U shape when seen in a planar view from the positive direction side in the x-axis direction.

The capacitor Cs2 preferably includes the internal conductors 38*d* and 38*g* and the ground conductors 39*a* and 39*b*. The internal conductors 38d and 38g are provided on the front surfaces of the insulating material layers 16f and 16h, respectively and each preferably have a T shape, for example. The via-hole conductors b89 and b90 extend through the insulating material layers 16f and 16g in the z-axis direction. The via-hole conductors b89 and b90 are connected in series, thereby constituting a single via-hole conductor. The end of the via-hole conductor b89 on the positive direction side in the z-axis direction is connected to the internal conductor 38d. The end of the via-hole conductor b90 on the negative direction side in the z-axis direction is connected to the internal conductor 38g. The internal conductors 38d and 38g and the ground conductor 39a face each other across the insulating material layers 16f and 16g. The internal conductor 38g and the ground conductor 39b face each other across the insulating material layer 16h. Thus, the capacitor Cs2 is provided between the internal conductors 38d and 38g and the ground conductors 39a and 39b.

The end of the via-hole conductor b88 on the negative direction side in the z-axis direction is connected to the internal conductor 38d. In addition, the end of the via-hole conductor b95 on the negative direction side in the z-axis direction is connected to the ground conductor 39a. Furthermore, the via-hole conductors b96 and b97 extend through the insulating material layers 16g and 16h in the z-axis direction. The via-hole conductors b96 and b97 are connected in series, thereby constituting a single via-hole conductor. The end of the via-hole conductor b96 on the positive direction side in the z-axis direction is connected to the ground conductor 39a. The end of the via-hole conductor b97 on the negative direction side in the z-axis direction is connected to the ground conductor 39b. Thus, the coil Ls2 and the capacitor Cs2 are connected in parallel, thereby constituting an LC parallel resonator LC2. In addition, the LC parallel resonator LC2 including the coil Ls2 and the capacitor Cs2 is connected to the land electrode 14b via the via-hole conductors b67 and b68.

As shown in FIGS. 4 and 5, the coil Ls3 preferably includes the internal conductors 18c and 18f and the via-hole conductors b69 to b71 and b75 to b79. More specifically, the internal conductors 18c and 18f are provided on the front surfaces of the insulating material layers 16b and 16c, respectively, and each have an L shape extending in the y-axis direction and bending at an end on the positive direction side in the y-axis direction to the negative direction side in the x-axis direction. The internal conductor 18c and the internal conductor 18f have the same shape and overlap each other so as to coincide with each other when seen in a planar view from the z-axis direction. In addition, the via-hole conductor b69 extends through the insulating material layer 16b in the z-axis direction and connects an end of the internal conductor 18c to an end of the internal conductor 18f. The via-hole conductor b75 extends through the insulating material layer 16b in the z-axis direction and connects another end of the internal conductor 18c to another end of the internal conductor 18f. Thus, the internal conductors 18c and 18f are connected to each other.

The via-hole conductors b70 and b71 extend through the insulating material layers 16c and 16d, respectively, in the z-axis direction. The via-hole conductors b70 and b71 are connected in series, thereby constituting a single via-hole conductor. The end of the via-hole conductor b70 on the positive direction side in the z-axis direction is connected to the end of the internal conductor 18f.

The via-hole conductors b76 to b79 extend through the insulating material layers 16c to 16f in the z-axis direction. The via-hole conductors b76 to b79 are connected in series, thereby constituting a single via-hole conductor. The end of the via-hole conductor b76 on the positive direction side in the z-axis direction is connected to the other end of the internal conductor 18f.

As described above, the coil Ls3 preferably is loop coil having a substantially U shape when seen in a planar view from the positive direction side in the x-axis direction.

The internal conductor 18m is provided on the front surface of the insulating material layer 16j and has a rectangular or substantially rectangular shape extending in the y-axis direction. The internal conductor 18m faces the land electrode 14c across the insulating material layer 16j within the laminate 12, has an area larger than that of the land electrode 14c, and contains the land electrode 14c when seen from the positive direction side in the z-axis direction (the lamination direction). No conductor layer is provided between the internal conductor 18m and the land electrode 14c.

The capacitor Cs3 preferably includes the internal conductors 18m, 38e, and 38h and the ground conductors 39a and 39b. The internal conductors 38e and 38h are provided on the front surfaces of the insulating material layers 16f and 16h, respectively, and each have a rectangular or substantially rectangular shape extending in the y-axis direction.

Furthermore, the ground conductor 39b is provided on the positive direction side of the internal conductor 18m in the z-axis direction (on the upper side thereof in the lamination direction). In addition, the internal conductor 38h is provided on the positive direction side of the ground conductor 39b in the z-axis direction (on the upper side thereof in the lamination direction). Thus, the internal conductor 18m and the ground conductor 39b face each other across the insulating material layer 16i. Similarly, the internal conductor 38h and the ground conductor 39b face each other across the insulating material layer 16h. In other words, capacitances are provided between the internal conductors 18m and 28h and the ground conductor 39b, respectively.

Furthermore, the ground conductor 39a is provided on the positive direction side of the internal conductor 38h in the z-axis direction (on the upper side thereof in the lamination direction). In addition, the internal conductor 38e is provided on the positive direction side of the ground conductor 39a in the z-axis direction (on the upper side thereof in the lamination direction). Thus, the internal conductor 38h and the ground conductor 39a face each other across the insulating material layer 16g. Similarly, the internal conductor 38e and the ground conductor 39a face each other across the insulating material layer 16f. In other words, capacitances are provided between the internal conductors 38e and 38h and the ground conductor 39a, respectively.

In addition, the via-hole conductors b72 to b74 extend through the insulating material layers 16e to 16g in the z-axis direction. The via-hole conductors b72 to b74 are connected in series, thereby constituting a single via-hole conductor. The end of the via-hole conductor b72 on the positive direction side in the z-axis direction is connected to the end of the via-hole conductor b71 on the negative direction side. The end of the via-hole conductor b72 on the negative direction side in the z-axis direction is connected to the internal conductor 38e. The end of the via-hole conductor b74 on the negative direction side in the z-axis direction is connected to the internal conductor 38h.

In addition, the via-hole conductors b82 and b83 extend through the insulating material layers 16h and 16i in the z-axis direction. The via-hole conductors b82 and b83 are connected in series, thereby constituting a single via-hole conductor. The via-hole conductors b82 and b83 extend through the inside of the cut A2. The end of the via-hole conductor b82 on the positive direction side in the z-axis direction is connected to the internal conductor 38h. The end of the via-hole conductor b83 on the negative direction side in the z-axis direction is connected to the internal conductor 18m. In other words, the via-hole conductors b82 and b83 connect the internal conductor 18m to the internal conductor 38h.

Since the internal conductors 18m, 38e, and 38h are connected as described above, four capacitors including the internal conductors 18m, 38e, and 38h and the ground conductors 39a and 39b are preferably connected, for example. By the four capacitances, the capacitor Cs3 is provided.

In addition, as described above, the end of the via-hole conductor b83 on the negative direction side in the z-axis direction is connected to the internal conductor 18m. Furthermore, the via-hole conductors b80 and b81 extend through the insulating material layers 16g and 16h in the z-axis direction. The via-hole conductors b80 and b81 are connected in series, thereby constituting a single via-hole conductor. The end of the via-hole conductor b80 on the positive direction side in the z-axis direction is connected to the end of the via-hole conductor b79 on the negative direction side in the z-axis direction. The end of the via-hole conductor b81 on the negative direction side in the z-axis direction is connected to the ground conductor 39b. Thus, the coil Ls3 and the capacitor Cs3 are connected in parallel, thereby constituting an LC parallel resonator LC3.

In addition, the via-hole conductor b84 extends through the insulating material layer 16j in the z-axis direction. The end of the via-hole conductor b84 on the positive direction side in the z-axis direction is connected to the internal conductor 18m. The end of the via-hole conductor b84 on the negative direction side in the z-axis direction is connected to the land electrode 14c. Thus, the LC parallel resonator LC3 including the coil Ls3 and the capacitor Cs3 is connected to the land electrode 14c via the via-hole conductor b84.

In addition, the via-hole conductors b67 and b68 extend through the insulating material layers 16i and 16j in the z-axis direction. The via-hole conductors b67 and b68 are connected in series, thereby constituting a single via-hole conductor. The end of the via-hole conductor b67 on the positive direction side in the z-axis direction is connected to the ground conductor 39b. The end of the via-hole conductor b68 on the negative direction side is connected to the land electrode 14b. Thus, the LC parallel resonator LC3 including the coil Ls3 and the capacitor Cs3 is connected to the land electrode 14b via the via-hole conductors b67 and b68.

The capacitor Cm1 preferably includes the internal conductor 38a and the internal conductor 38d. The internal conductor 38a is provided on the front surface of the insulating material layer 16e and has an L shape extending in the y-axis direction and bending at an end on the positive direction side in the y-axis direction to the positive direction side in the x-axis direction. In addition, the internal conductor 38a is connected to the via-hole conductors b53 and b54. As described above, the internal conductor 38d is provided on the front surface of the insulating material layer 16f and has a T shape. In addition, the internal conductor 38d is connected to the via-hole conductors b88 and b89. The internal conductor 38a and the internal conductor 38d face each other across the insulating material layer 16e. Thus, the capacitor Cm1 is provided between the internal conductor 38a and 38d.

The capacitor Cm2 preferably includes the internal conductor 38b and the internal conductor 38d. The internal conductor 38b is provided on the front surface of the insulating material layer 16e and has an L shape extending in the y-axis direction and bending at an end on the positive direction side in the y-axis direction to the negative direction side in the x-axis direction. In addition, the internal conductor 38b is connected to the via-hole conductors b71 and b72. As described above, the internal conductor 38d is provided on the front surface of the insulating material layer 16f and has a T shape. The internal conductor 38b and the internal conductor 38d face each other across the insulating material layer 16e. Thus, the capacitor Cm2 is provided between the internal conductors 38b and 38d.

The capacitor Cp1 preferably includes the internal conductor 18g and the internal conductors 38a and 38b. The internal conductor 18g is provided on the front surface of the insulating material layer 16d and has a rectangular or substantially rectangular shape extending in the x-axis direction. The internal conductor 18g and the internal conductors 38a and 38b face each other across the insulating material layer 16d. Thus, two capacitors are formed between the internal conductor 38a and 18g and between the internal conductors 18g and 38b. These two capacitors are connected in series, thereby constituting the capacitor Cp1.

The electronic component 10a configured as described above is also preferably used as, for example, a band-pass filter. It should be noted that the operation of the electronic component 10a is the same as the operation of the electronic component 10, and thus the description thereof is omitted.

In the electronic component 10a, similarly to the electronic component 10, desired capacitance values can be obtained at the capacitors Cs1 and Cs3 having desired capacitance values. Furthermore, in the electronic component 10a, similarly to the electronic component 10, even when the capacitors Cs1 and Cs3 having desired capacitance values are obtained, insulation between the land electrodes 14a to 14c can be maintained.

In addition, according to the electronic component 10a, even when the insulating material layers 16h to 16j shift in the x-axis direction in laminating the insulating material layers 16h to 16j, the capacitance values of the capacitors Cs1 and Cs3 are unlikely to vary. More specifically, as shown in FIG. 6, the depths D1 and D2 of the cuts A1 and A2 in the x-axis direction are larger than the widths D3 and D4, respectively, in the x-axis direction, of the portions of the internal conductors 18l, 18m, 38f, and 38h that overlaps the cuts A1 and A2. Thus, even when the insulating material layers 16h to 16j shift slightly in the x-axis direction, the areas of the portions where the internal conductors 18l, 18m, 38f, and 38h and the ground conductor 39b face each other do not change. As a result, according to the electronic component 10a, even when the insulating material layers 16h to 16j shift in the x-axis direction in laminating the insulating material layers 16h to 16j, the capacitance values of the capacitors Cs1 and Cs3 are unlikely to vary.

Figure 7:
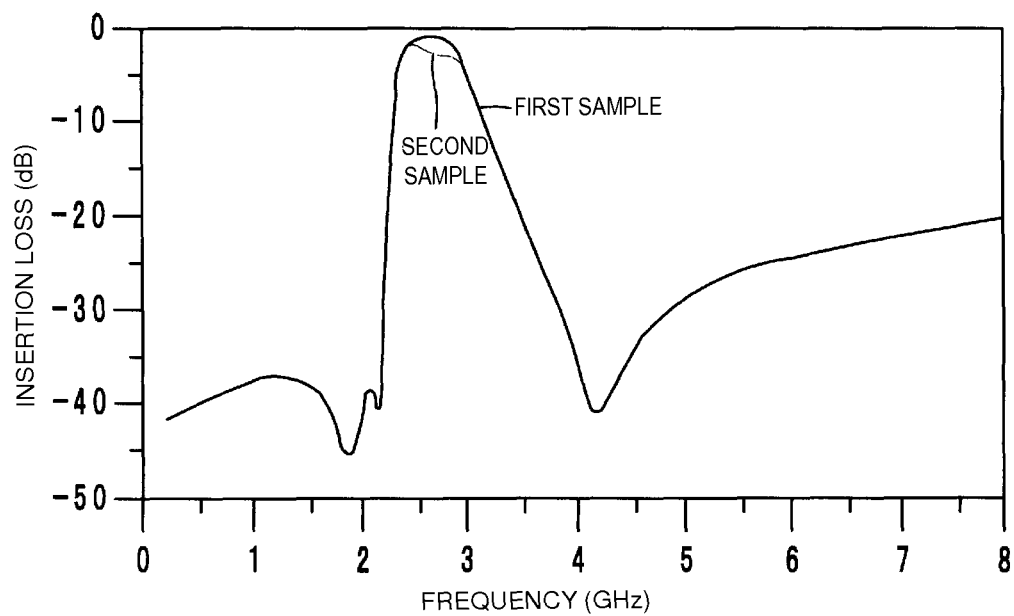
FIG. 7 is a graph showing an experimental result.

In order to demonstrate that variations of the capacitance values of the capacitors Cs1 and Cs3 can be significantly reduced and prevented, the inventor of the preferred embodiments of the present invention described and claimed in the present application conducted an experiment described below. Specifically, the electronic component 10a was produced as a first sample, and an electronic component in which the cuts A1 and A2 are not provided was produced as a second sample. The configuration other than the cuts A1 and A2 in the second sample is the same as that in the first sample. The relationship between frequency and insertion loss was checked using the first sample and the second sample. FIG. 7 is a graph showing the experimental result. The vertical axis indicates insertion loss, and the horizontal axis indicates frequency.

According to FIG. 7, it appears that in the second sample, in the passband of high-frequency signals, the insertion loss is greater than that in the first sample. This is thought to be because in the second sample, a lamination shift occurs and the capacitance values of the capacitors Cs1 and Cs3 are decreased. Thus, according to the electronic component 10a, it is recognized that the capacitance values of the capacitors Cs1 and Cs3 are unlikely to vary.

In addition, in the electronic component 10a, variations of the capacitance values of the capacitors Cs1 to Cs3 can be significantly reduced and prevented. More specifically, each of the capacitors Cs1 to Cs3 preferably includes a plurality of parallel-connected capacitors defined by a plurality of the internal conductors 18 and 38 and a plurality of the ground conductors 39. Thus, the capacitance values of the plurality of capacitors constituting each of the capacitors Cs1 to Cs3 are relatively small. Therefore, even when the capacitance value of one capacitor among the plurality of capacitors varies due to a lamination shift or the like, the variation amounts of the capacitance values of the capacitors Cs1 to Cs3 are relatively small. Thus, in the electronic component 10a, variations of the capacitance values of the capacitors Cs1 to Cs3 can be significantly reduced and prevented.

Modified Example

Figure 8:
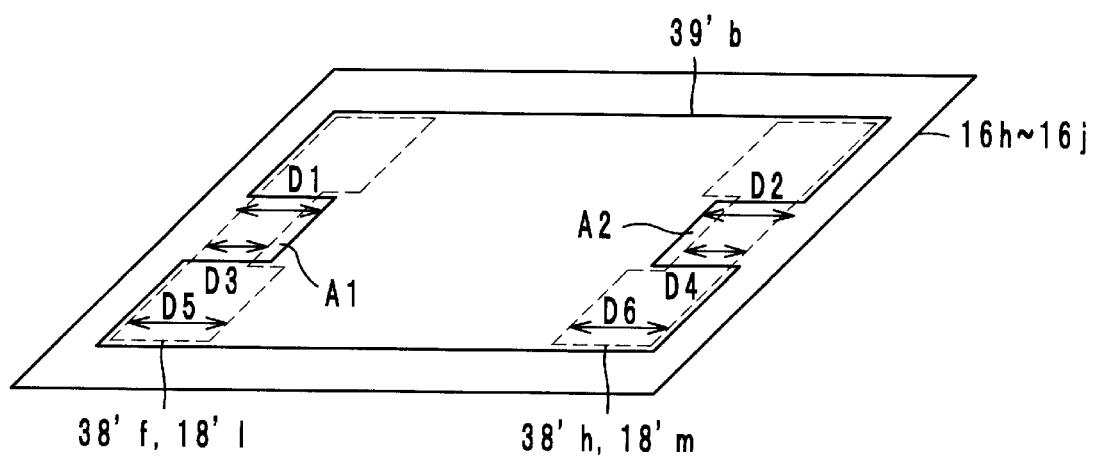
FIG. 8 is a diagram in which insulating material layers are laminated.

Hereinafter, internal conductors 18'l, 18'm, 38'f, and 38'h and a ground conductor 39'b according to a modified example of a preferred embodiment of the present invention will be described with reference to the drawing. FIG. 8 is a diagram in which insulating material layers 16h to 16j are laminated.

As shown in FIG. 8, the depths D1 and D2 of the cuts A1 and A2 in the x-axis direction are larger than the widths D3 and D4, respectively, in the x-axis direction, of the portions of the internal conductors 18'1, 18'm, 38'f, and 38'h that overlap the cuts A1 and A2. It should be noted that the widths D3 and D4, in the x-axis direction, of the portions of the internal conductors 18'l, 18'm, 38'f, and 38'h that overlap the cuts A1 and A2 are smaller than the widths D5 and D6, in the x-axis direction, of the other portions of the internal conductors 18'1, 18'm, 38'f, and 38'h. Thus, the depths D1 and D2 of the cuts A1 and A2 in the x-axis direction can be decreased.

Third Preferred Embodiment

Figure 9:
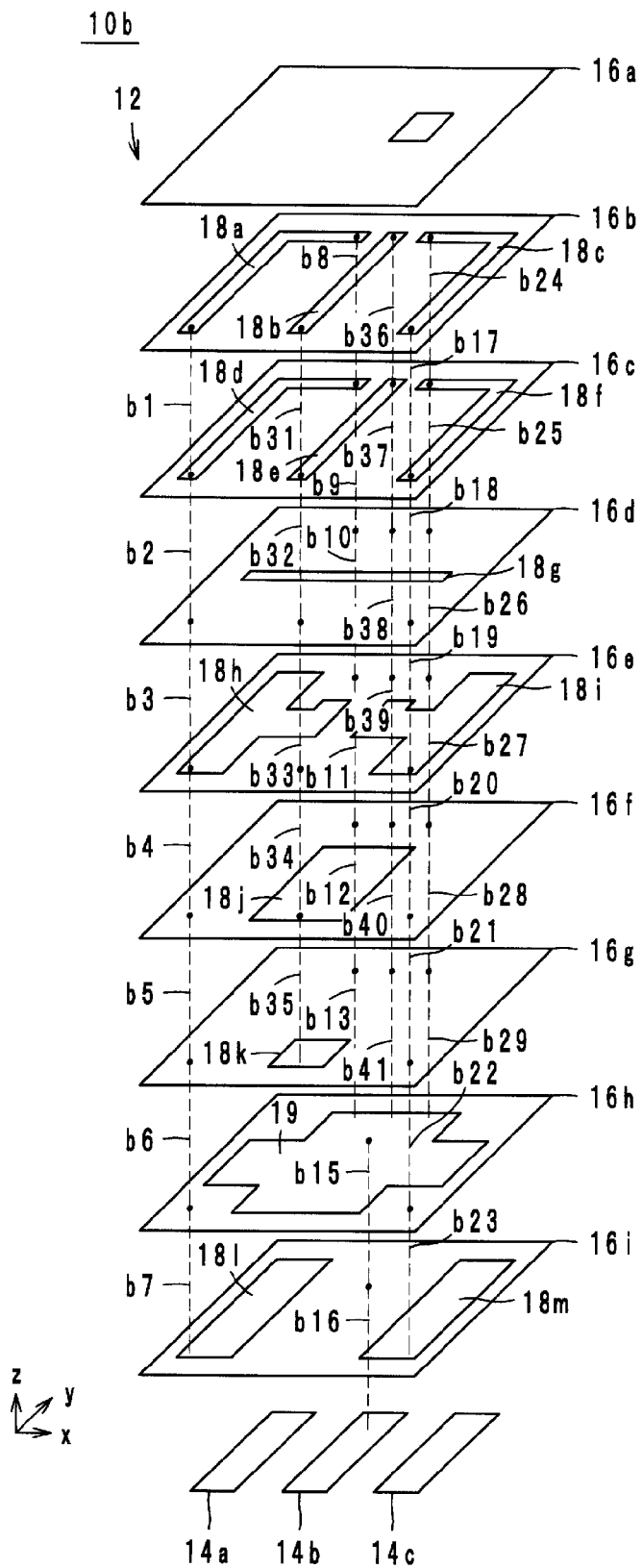
FIG. 9 is an exploded perspective view of an electronic component according to a third preferred embodiment of the present invention.
Figure 10:
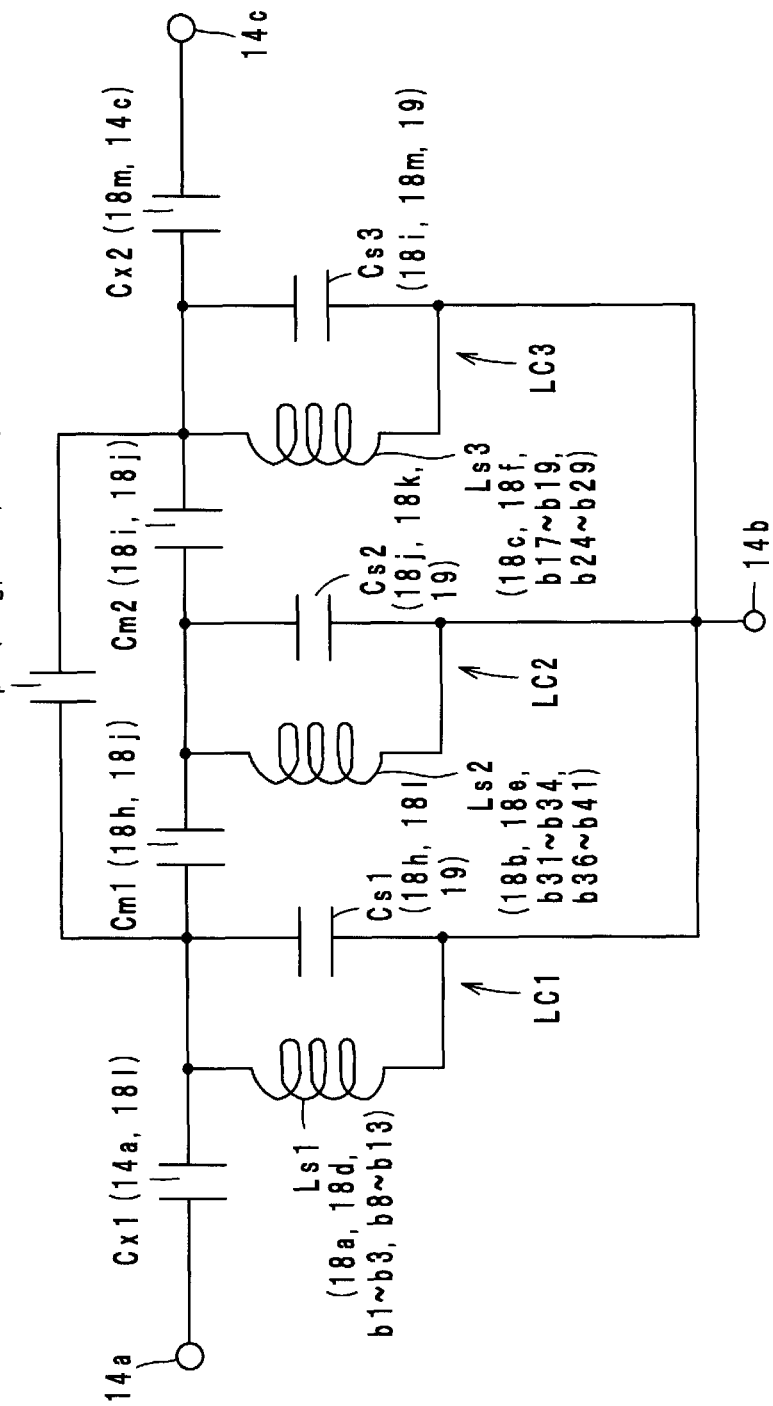
FIG. 10 is an equivalent circuit diagram of the electronic component according to the third preferred embodiment of the present invention.
Figure 11:
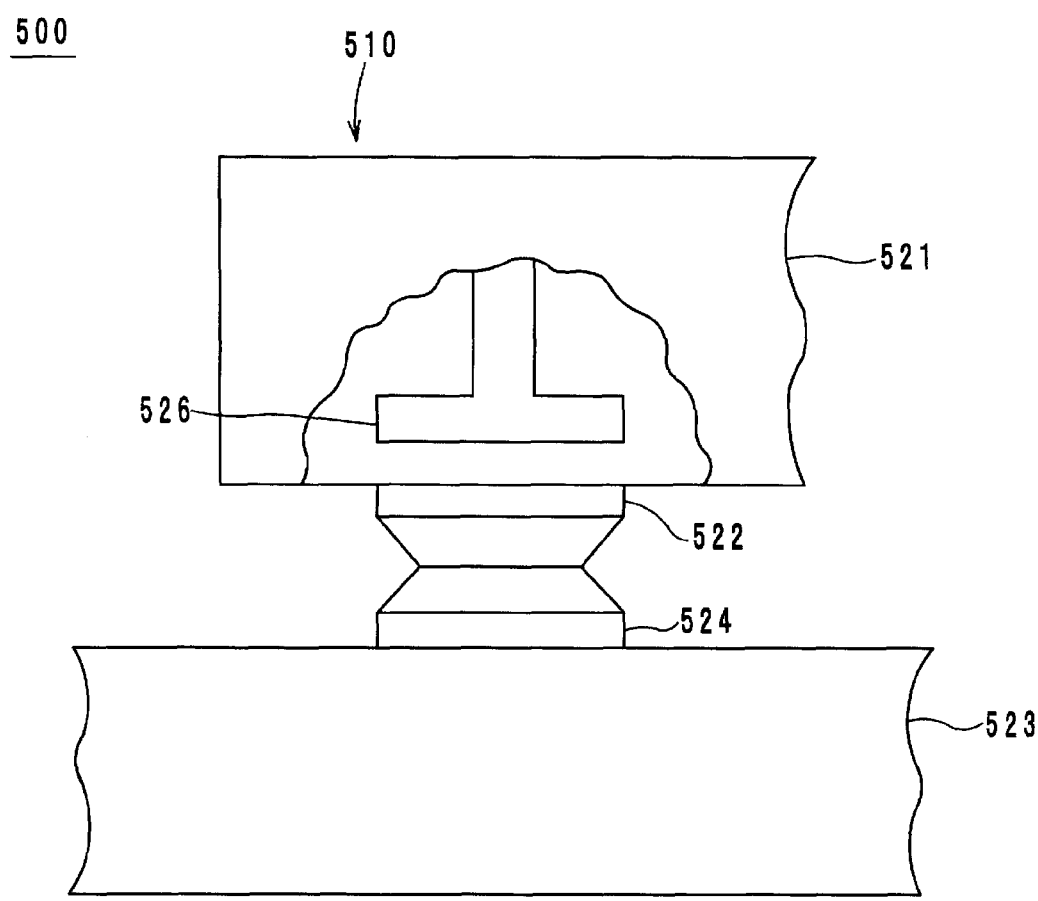
FIG. 11 is a cross-sectional structure diagram of an electronic device including a surface-mounted component described in Japanese Unexamined Patent Application Publication No. 2003-68569.

Hereinafter, the configuration of an electronic component 10b according to a third preferred embodiment will be described with reference to the drawings. FIG. 9 is an exploded perspective view of the electronic component 10b according to the third preferred embodiment. FIG. 10 is an equivalent circuit diagram of the electronic component 10b according to the third preferred embodiment. It should be noted that for an external perspective view of the electronic component 10b, FIG. 1 is used. In addition, among the elements of the electronic component 10b, the same elements as those of the electronic component 10 are designated by the same reference signs.

The difference between the electronic component 10b and the electronic component 10 is the presence/absence of the via-hole conductors b14 and b30. More specifically, as shown in FIG. 9, in the electronic component 10b, no via-hole conductor is provided between a land electrode 14a and an internal electrode 18l. Thus, the land electrode 14a and the internal electrode 18l face each other across an insulating material layer 16i in a state of being insulated from each other. Therefore, a capacitor Cx1 is provided between the land electrode 14a and the internal electrode 18l. In addition, no via-hole conductor is provided between a land electrode 14c and an internal electrode 18m. Thus, the land electrode 14c and the internal electrode 18m face each other across the insulating material layer 16i in a state of being insulated from each other. Therefore, a capacitor Cx2 is provided between the land electrode 14c and the internal electrode 18m.

The electronic component 10b configured as described above is preferably used as, for example, a band-pass filter. It should be noted that the operation of the electronic component 10b is the same as the operation of the electronic component 10, and thus the description thereof is omitted.

In the electronic component 10b, similarly to the electronic component 10, desired capacitance values can be obtained at the capacitors Cs1 and Cs3.

In addition, according to the electronic component 10b, even when the land electrodes 14a and 14c slightly shift in printing the land electrodes 14a and 14c, the capacitance values of the capacitors Cx1 and Cx2 are unlikely to vary. More specifically, the internal conductors 18l and 18m face the land electrodes 14a and 14c, respectively, across the insulating material layer 16i within the laminate 12, have areas larger than those of the land electrodes 14a and 14c, respectively, and contain the land electrodes 14a and 14c, respectively, when seen from the positive direction side in the z-axis direction (the lamination direction). Therefore, even when the internal conductors 18l and 18m or the land electrodes 14a and 14c constituting the capacitors Cx1 and Cx2 slightly shift, the areas of the portions where the internal conductors 18l and 18m face the land electrodes 14a and 14c do not change. As a result, in the electronic component 10b, even when the land electrodes 14a and 14c slightly shift in printing the land electrodes 14a and 14c, the capacitance values of the capacitors Cx1 and Cx2 are unlikely to vary.

Furthermore, according to the electronic component 10b, even when the positions where the land electrodes 14a and 14c are printed slightly shift, a state is kept in which the land electrodes 14a and 14c are contained in the internal conductors 18l and 18m when seen in a planar view from the z-axis direction. Because of this, in the electronic component 10, formation of capacitances due to the land electrodes 14a and 14c protruding from the internal conductors 18l and 18m to face the ground electrode 19 is significantly reduced and prevented. Therefore, deviation of the capacitors Cx1 and Cx2 from the desired capacitance values is significantly reduced and prevented, and change of the characteristics of the electronic component 10b due to an unnecessary capacitance can be prevented.

As described above, preferred embodiments of the present invention are useful for electronic components, and in particular, are excellent in that a capacitor having a desired capacitance value can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a laminate including a plurality of insulating material layers laminated on each other in a lamination direction;
   a land electrode provided on a bottom surface of the laminate;
   a first capacitor conductor facing the land electrode across the insulating material layer within the laminate, having an area larger than that of the land electrode, and containing the land electrode when being seen in a planar view from the lamination direction;

a second capacitor conductor provided on an upper side of the first capacitor conductor in the lamination direction and facing the first capacitor conductor;
a third capacitor conductor provided on an upper side of the second capacitor conductor in the lamination direction and facing the second capacitor conductor; and
a first via-hole conductor connecting the first capacitor conductor to the third capacitor conductor; wherein
the second capacitor conductor is provided with a cut recessed from an outer rim toward a predetermined direction;
the first via-hole conductor extends through an inside of the cut;
a depth of the cut in the predetermined direction is larger than a width, in the predetermined direction, of a portion of the third capacitor conductor that overlaps the cut; and
the second capacitor conductor is a ground conductor.

2. The electronic component according to claim 1, wherein no conductor layer is provided between the land electrode and the first capacitor conductor.

3. The electronic component according to claim 1, wherein the first capacitor conductor and the second capacitor conductor define a capacitor, and the capacitor defines a portion of an LC filter included in the laminate.

4. The electronic component according to claim 1, further comprising a second via-hole conductor connecting the land electrode to the first capacitor conductor.

* * * * *